(12) United States Patent
Nautiyal et al.

(10) Patent No.: US 10,074,410 B2
(45) Date of Patent: Sep. 11, 2018

(54) INTEGRATED CIRCUIT USING SHAPING AND TIMING CIRCUITRIES

(71) Applicant: ARM Limited, Cambridge (GB)

(72) Inventors: Vivek Nautiyal, Milpitas, CA (US); Jitendra Dasani, Cupertino, CA (US); Fakhruddin Ali Bohra, Austin, TX (US); Satinderjit Singh, Fremont, CA (US); Shri Sagar Dwivedi, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/282,532

(22) Filed: Sep. 30, 2016

(65) Prior Publication Data

US 2018/0096715 A1 Apr. 5, 2018

(51) Int. Cl.

| | |
|---|---|
| *G11C 7/22* | (2006.01) |
| *G11C 7/12* | (2006.01) |
| *G11C 5/14* | (2006.01) |
| *G11C 8/08* | (2006.01) |

(52) U.S. Cl.
CPC ............ *G11C 7/12* (2013.01); *G11C 5/147* (2013.01); *G11C 7/22* (2013.01); *G11C 7/227* (2013.01); *G11C 8/08* (2013.01)

(58) Field of Classification Search
CPC .. G11C 8/08; G11C 7/22; G11C 7/227; G11C 5/147; G11C 7/12
USPC ......... 365/189.09, 191, 194, 189.06, 189.11, 365/230.06, 230.08, 233.1
See application file for complete search history.

(56) References Cited

U.S. PATENT DOCUMENTS

| | | | |
|---|---|---|---|
| 5,161,121 A | 11/1992 | Cho | |
| 5,706,245 A * | 1/1998 | Kim | G11C 8/10 365/230.03 |
| 5,708,621 A * | 1/1998 | Tanoi | G11C 8/14 257/E23.142 |
| 5,802,004 A * | 9/1998 | McClure | G11C 5/063 365/190 |
| 6,111,813 A | 8/2000 | Huang | |
| 6,252,814 B1 | 6/2001 | Tran et al. | |
| 6,278,653 B1 | 8/2001 | Hardee | |

(Continued)

OTHER PUBLICATIONS

Redeau, et al.; U.S. Appl. No. 15/093,470, filed Apr. 7, 2016.

*Primary Examiner* — Tan T Nguyen
(74) *Attorney, Agent, or Firm* — Pramudji Law Group PLLC; Ari Pramudji

(57) ABSTRACT

Various implementations described herein may refer to and may be directed to an integrated circuit using shaping and timing circuitries. In one implementation, an integrated circuit may include memory that is accessed based on a voltage level on a first control line, and may include a control driver circuitry coupled to the first and a second control line that drives a first and a second control signal toward first or second voltage levels. The integrated circuit may include a shaper circuitry coupled to the control lines that includes a first clamping transistor that couples the first control line to a timed supply node in response to the driving of the second control signal toward the first voltage. The integrated circuit may include a timing circuitry coupled to the first shaper circuitry that includes a header transistor that couples the timed supply node to a voltage supply source.

18 Claims, 8 Drawing Sheets

(56) References Cited

U.S. PATENT DOCUMENTS

| | | | |
|---|---|---|---|
| 7,436,690 B2 * | 10/2008 | Chen | G11C 17/126 |
| | | | 257/E21.668 |
| 7,570,504 B2 | 8/2009 | Vo | |
| 7,993,961 B2 | 8/2011 | Oh et al. | |
| 8,014,226 B2 * | 9/2011 | Yeung | G11C 8/08 |
| | | | 327/536 |
| 8,437,166 B1 | 5/2013 | Huang et al. | |
| 8,451,679 B1 | 5/2013 | Sharpe-Geisler et al. | |
| 8,582,340 B2 | 11/2013 | Chong et al. | |
| 8,611,172 B2 | 12/2013 | Shyanmugam et al. | |
| 9,105,315 B2 * | 8/2015 | Hold | G11C 11/413 |
| 2003/0132792 A1 | 7/2003 | Acharya et al. | |
| 2009/0027099 A1 | 1/2009 | Howard et al. | |
| 2014/0286096 A1 | 11/2014 | Chong et al. | |
| 2015/0371686 A1 | 12/2015 | Van Winkelhoff et al. | |

* cited by examiner

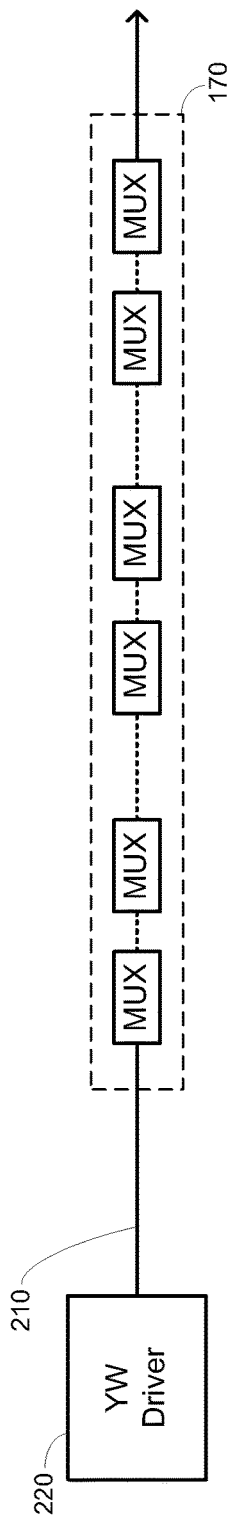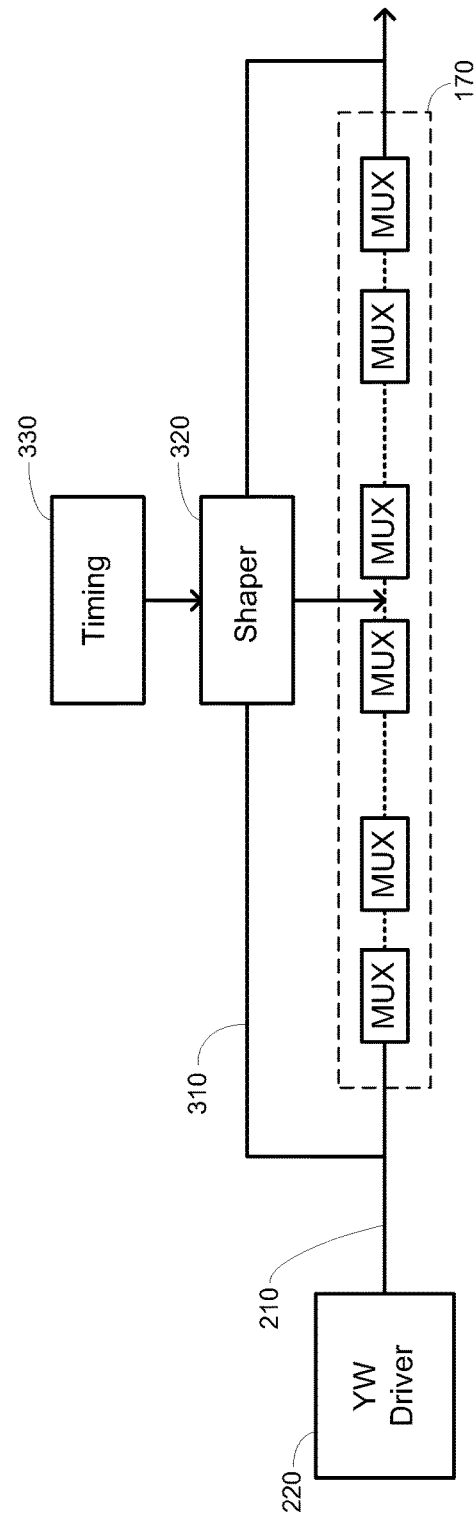

INTEGRATED CIRCUIT USING SHAPING AND TIMING CIRCUITRIES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to write data to the memory cells and read data from the memory cells. In particular, the memory cells of a memory array, such as a random access memory (RAM) array, may be organized into rows and columns. The logic latches within these individual memory cells may be used to store a data bit that is representative of a logical "1" or "0." These memory cells may also be interconnected by word lines (WL) and pairs of complementary bit lines (BL).

Various critical lines carrying critical signals may be used to control access to the memory cells of the memory array. For example, the critical lines carrying critical signals may include word lines carrying word line signals, where the word lines run through the memory array and are used to select a row of memory cells to be accessed. In another example, the critical lines carrying critical signals may include control lines carrying control signals, where the control signals may be used to perform particular access operations on the memory cells. Such control signals may include a column select signal, a write enable signal, a precharge signal, and/or the like.

Further, when used to access particular memory cells of the array, critical line driver circuitry may be used to drive a particular critical signal on a critical line to an asserted voltage. However, as process geometries have become smaller and memory densities higher, problems have arisen in propagation of the critical signal along its corresponding critical line. In particular, the critical lines may be implemented using one or more metal layers of the IC. As such, each critical line may have a finite resistance and capacitance, causing the critical line to behave as a distributed RC element, which may slow the critical signal from rising to the asserted value driven by critical line driver circuitry.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

FIG. 2 illustrates a block diagram of a control line in connection with various implementations described herein.

FIGS. 3-4 illustrate block diagrams of control lines in accordance with various implementations described herein

DETAILED DESCRIPTION

Various implementations described herein may refer to and may be directed to an integrated circuit using shaping and timing circuitries. For instance, in one implementation, an integrated circuit may include a memory array having a plurality of memory cells, where the memory cells are configured to be accessed based on a voltage level on a first control line. The integrated circuit may also include a control driver circuitry coupled to the first control line and a second control line, where the control driver circuitry is configured to drive a first control signal of the first control line and a second control signal of the second control line toward a first voltage level or a second voltage level, and where the first control line and the second control line are implemented using different metal layers of the integrated circuit. The integrated circuit may further include a shaper circuitry coupled to the first control line and to the second control line, where the shaper circuitry includes a first clamping transistor configured to couple the first control line to a timed supply node in response to the control driver circuitry driving the second control signal toward the first voltage. The integrated circuit may additionally include a timing circuitry coupled to the first shaper circuitry, where the timing circuitry includes a header transistor configured to couple the timed supply node to a voltage supply source based on a voltage level of a third control signal, where a voltage level provided by the voltage supply source is substantially equal to the first voltage level, and where the voltage level of the third control signal corresponds to the voltage level of the second control signal after a predetermined delay.

Various implementations of an integrated circuit using shaping and timing circuitries will now be described in more detail with reference to FIGS. 1-12.

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like.

Figure 1:
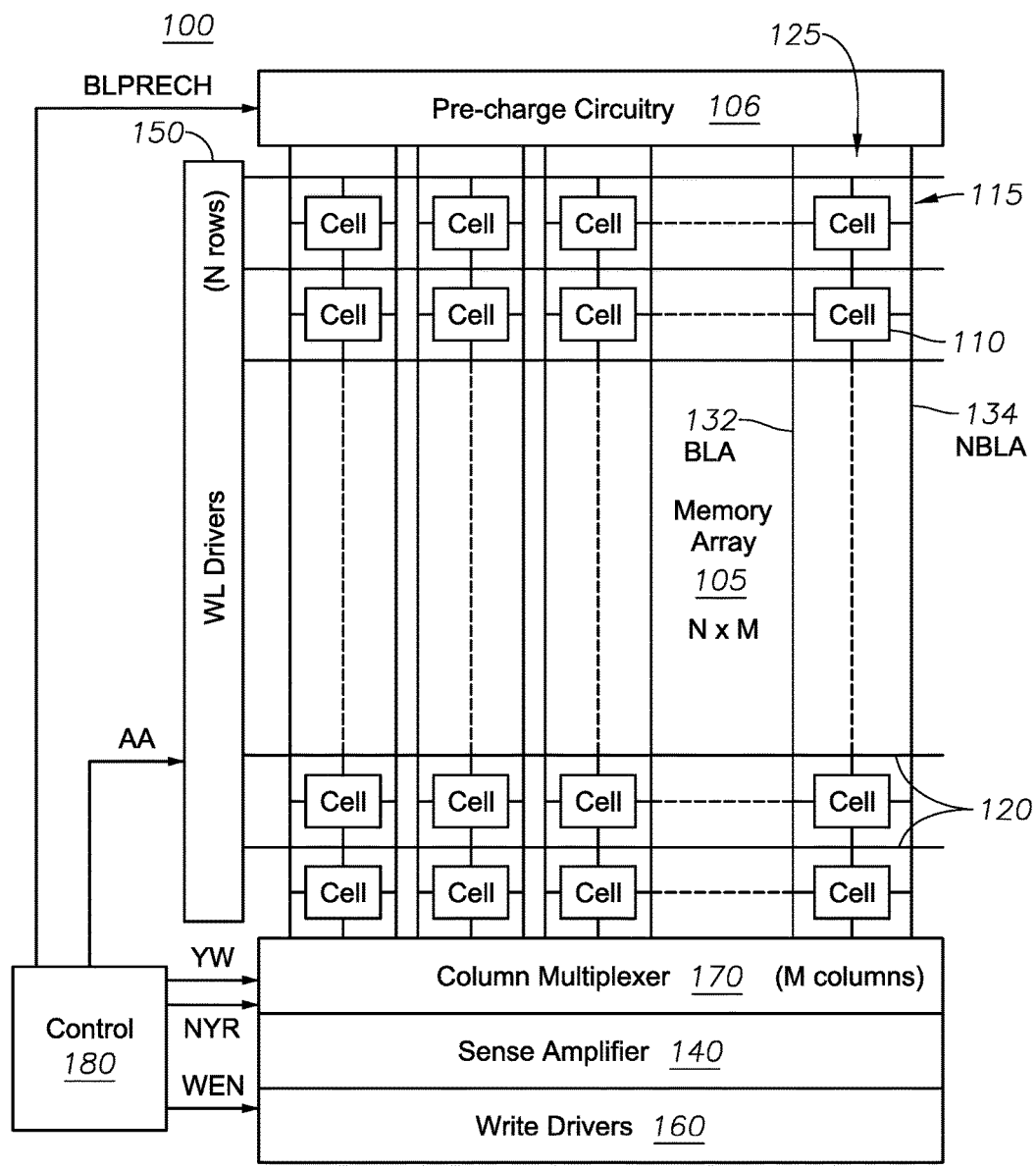
FIG. 1 illustrates a block diagram of an embedded memory device in connection with various implementations described herein.

For example, FIG. 1 illustrates a block diagram of an embedded memory device 100 in connection with various implementations described herein. The memory device 100 may include one or more memory arrays 105, pre-charge circuitry 106, one or more word line drivers 150, one or more column multiplexers 170, one or more sense amplifiers 140, one or more write drivers 160, and control circuitry 180. In particular, the memory array 105 may be a random-access memory (RAM) array, such as a static RAM (SRAM) array, a dynamic RAM (DRAM) array, a correlated electron RAM (ceRAM) array, a ferroelectric RAM (feRAM) array, and/or any other implementation known to those skilled in the art. In some implementations, the memory array 105 may be implemented as a single rail memory array, a dual rail memory array, or any other such implementation known to those skilled in the art.

The memory array 105 may include a plurality of individual memory cells 110, which may be organized in rows 115 and columns 125. As shown in FIG. 1, the array may have N rows and M columns, and, therefore, may have N x M individual memory cells 110. Each memory cell 110 may be used to store a data bit that is representative of a logical "1" or "0". As illustrated in FIG. 1, each row 115 of memory cells 110 may be connected to at least one of a plurality of word lines (WL) 120, where each word line 120 may be activated for a particular row of memory cells 110. In some implementations, each row 115 of memory cells 110 may be used to store a word of data. In other implementations, the row may store part of the word or multiple words, such as a half word or a double word.

In particular, a row decoder (not pictured) may receive address information (e.g., an address word) and then, in conjunction with one of the word line drivers 150, enable the row 115 corresponding to the address word. Each word line driver 150 may be used to drive a word line signal on a word line of the memory array 210 to an asserted voltage level. In one implementation, the row decoder may be part of the control circuitry 180.

Further, each column 125 of memory cells 110 may be connected to at least one of a plurality of column bit lines (BL). In one implementation, a particular memory cell 110 may be coupled to at least one pair of complementary bit lines, such as BLA 132 and NBLA 134. The bit lines may be used to either store a data bit into a particular cell 110 during a write operation, or to read a stored bit from the particular cell 110 during a read operation. A column decoder (not pictured) may receive address information and enable columns 125 corresponding to the address. The number of columns 125 activated may depend on the size of the word to be stored. In one implementation, the column decoder may be part of the control circuitry 180.

One or more sense amplifiers 140 may be connected to the plurality of column bit lines. The sense amplifier 140 may amplify differential voltage signals between the complementary bit lines 132, 134 of the memory array 105 during a read operation. These small differential voltage signals may be representative of the data value stored in a particular individual memory cell 100, and may be amplified by the sense amplifier to a recognizable logic level to allow the data value of the cell 100 to be properly interpreted by logic outside of the memory array 105.

In one implementation, one or more column multiplexers 170 may be used to multiplex the pair of complementary bit lines in a column 125 into a single set of sense amplifiers 140. In addition, as is known to those skilled in the art, the one or more write drivers 160 may be used in conjunction with the column multiplexers 170 to drive a data value onto the bit lines. In another implementation, during periods when there is no read or write operation, the pre-charge circuitry 106 may be enabled to pre-charge the voltage level on the complementary bit lines 132, 134.

The control circuitry 180 may be used to control access to the memory cells 110 of the memory array 105. In particular, the control circuitry 180 may use one or more control signals to perform particular access operations with respect to the memory cells. Such control signals may include, but are not limited to, a write column select signal, a read column select signal, a write enable signal, a pre-charge signal, and/or the like.

For example, the control circuitry 180 may transmit an output signal AA to the word line drivers 150. The output signal AA may include decoded address signals, and the output signal AA may be used by the word line drivers 150 to activate one of the word lines of the array 105. In another example, the control circuitry 180 may transmit a write enable signal WEN to the write drivers 160. The write enable signal WEN may enable the write drivers 160 to perform a write operation using the bit lines of the array 105. In yet another example, the control circuitry 180 may transmit a write column select signal YW and/or a read column select signal NYR to the column multiplexers 170, where the column multiplexers 170 may use the write column select signal YW and/or a read column select signal NYR to select a particular pair of complementary bit lines in a column 125 into a single set of sense amplifiers 140 for a write or read operation. In another example, the control circuitry 180 may transmit a pre-charge signal BLPRECH to enable the pre-charge circuitry 106 to pre-charge a voltage level on complementary bit lines.

Though not shown in FIG. 1, one or more control lines may be used to carry the one or more control signals, and each control line maybe coupled to a control line driver circuitry to drive a particular control signal on the control line toward an asserted voltage level. For example, a YW line may be used to carry the YW signal, and YW driver circuitry may be used to drive the YW signal on the YW line to an asserted voltage level. Other control signals and control lines known to those skilled in the art may be used, as well.

Collectively, the word line signals and control signals may hereinafter be referred to as critical signals, where the critical signals may be used to control access to the memory cells of the memory array. Similarly, the word lines and control lines may hereinafter be referred to as critical lines, where critical lines carry corresponding critical signals and critical line driver circuitry may be used to drive a particular critical signal on a critical line to an asserted voltage. As is known in the art, such critical lines may be implemented using one or more metal layers of an integrated circuit.

As process geometries have become smaller (e.g., 16 nanometer (nm), 7 nm, and/or the like) and memory densities higher, problems have arisen in propagation of a critical signal along its corresponding critical line. Each critical line may itself have a finite resistance and capacitance, causing the critical line to behave as a distributed RC element, which inhibits the rising or lowering of the critical signal to the asserted value when driven by critical line driver circuitry. This may lead to degradation in signal slope, slew rate, and/or pulse width quality of a critical signal. In one implementation, the asserted voltage level may be equal to a level supplied by power supply voltage (e.g., $V_{DD}$). In such an implementation, a control line driver circuitry may drive the critical signal to rise toward the asserted voltage level. In another implementation, the asserted voltage level may be equal to a reference voltage level, such as that provided via a ground voltage. In such an implementation, a control line driver circuitry may drive the critical signal to fall to the asserted voltage level.

As such, there may be a delay in a critical signal reaching its full asserted value, and this delay may increase the farther along a critical line that the signal propagates. Thus, the critical signal may not properly reach its asserted value in sufficient time towards the edges of a memory array, which may be distal from the control line driver circuitry. Such issues may be more prevalent for memory arrays having wide geometries or ICs at slow process corners.

Further, the problems of the critical signal being unable to reach its asserted voltage levels may be made worse when operating at lower operating voltages, despite such lower operating voltages being utilized for other reasons, such as power saving. In addition, smaller process geometries may suffer from more chip-to-chip variation and even significant amounts of variation due to process, voltage and temperature within an individual chip. Moreover, coupling the critical lines to other components, such as access transistors, multiplexers, and/or the like, may further degrade the signal slope, slew rate, and/or pulse width quality of the critical signal, which may be due to the additional resistance and capacitance of those coupled component. The effects of such couplings may become worse as process geometries become smaller.

Together, these factors may be cumulative, and they may combine to degrade the signal slope, slew rate, and/or pulse width quality of the critical signal such that the critical signal may fail to reach the asserted voltage level. Accordingly, the read/write operations of the memory array may slow overall, since an increased amount of time has to be allotted to allow for the critical signal to reach its asserted voltage level.

Repeaters may be used along a critical line to help propagate a critical signal along the critical line, which may help the critical signal reach its asserted value in sufficient time towards the edges of a memory array. However, such repeaters may have their own associated delay, which may become more dominant at a slow process corner. In addition, the placement of repeaters along a critical line can lead to area costs on an IC.

In view of the above, various implementations described herein may include an IC using a shaping circuitry and a timing circuitry, where the shaping circuitry and the timing circuitry may be used to further drive a critical signal on a critical line toward one or more asserted voltage levels. As further explained below, different metal layers may also be used for the critical signal.

Control Signals

As noted above, critical signals may include one or more control signals, such as a write column select signal YW, a read column select signal NYR, a write enable signal WEN, a pre-charge signal BLPECH, and/or the like. Further, as described above, one or more control lines may be used to carry the one or more control signals, and each control line maybe coupled to a control line driver circuitry to drive a particular control signal on the control line toward one or more asserted voltage levels.

For example, FIG. 2 illustrates a block diagram of a YW line 210 in connection with various implementations described herein. As shown, the YW line 210 may be coupled to a YW line driver 220, which may be coupled to one end of the line 210 and configured to drive a YW signal on the line 210 to one or more asserted voltage levels. In one implementation, the YW line driver 220 may be coupled between a control circuitry 180 (not shown) and one or more column multiplexers (MUXs) 170, such that the YW signal may be transmitted from the control circuitry 180 to the column multiplexers 170 via the driver 220 and the line 210. In one implementation, the YW line 210 may be implemented using lower metal layer of the IC 100, such as a first metal layer (M1). In addition, as shown, the line 210 may be coupled to a number of column multiplexers 170. As such, the resistive and capacitive loads from the YW line 210 itself and each column multiplexer 170 may degrade the signal slope, slew rate, and/or pulse width quality of the YW signal, where the YW signal may fail to reach the one or more asserted voltage levels.

As shown in FIG. 3, in one implementation, another YW line 310, a shaper circuitry 320, and a timing circuitry 330 may be used to further drive the YW signal on the YW line 210 to one or more asserted voltage levels. In particular, FIG. 3 illustrates a block diagram of a YW control line 210 and a control line 310 in accordance with various implementations described herein.

In particular, the shaper circuitry 320 may be coupled to the YW line 210, and it may be configured to further drive the YW signal on the YW line 210 toward the one or more asserted voltage levels, as described later in more detail. For example, the shaper circuitry 320 may be configured to apply a power supply voltage (e.g., $V_{DD}$) to the line 210 to further drive the YW signal on the YW line 210 toward a $V_{DD}$ voltage level. In another example, the shaper circuitry 320 may be configured to apply a ground voltage to the line 210 to further drive the YW signal on the YW line 210 toward a reference voltage level.

The shaper circuitry 320 may also be coupled to the YW line 310, where the YW signal on the YW line 310 may be used to trigger the operation of the shaper circuitry 320. As shown, in addition to the line 210, the YW line driver 220 may be configured to also drive the YW signal on the line 310 to one or more asserted voltage levels. However, in one implementation, the YW line 310 may be implemented using a different metal layer than that of the YW line 210, such as an upper metal layer of the IC 100 (e.g., a third metal layer (M3)). Further, as shown, the YW line 310 may not be coupled to the column multiplexers 170. As such, the YW line 310 may not be encumbered by the resistive and capacitive loads from each column multiplexer 170, in contrast to the YW line 210. Accordingly, the YW signal on the YW line 310 may reach the one or more asserted voltage levels faster than the YW signal on the YW line 210.

Using the faster YW signal on the YW line 310 to trigger the shaper circuitry 320 may allow the shaper circuitry 320 to further drive the signal on the YW line 210 during a rising edge and/or falling edge of the YW signal on the line 210. For example, the shaper circuitry 320 may be configured to apply a power supply voltage (e.g., $V_{DD}$) to the YW line 210 during a rising edge of the YW signal on the line 210. In another example, the shaper circuitry 320 may be configured to apply a ground voltage to the line 210 during a falling edge of the YW signal on the line 210. In such an example, the ability of the YW signal on the YW line 210 to rise or fall toward an asserted voltage level may be increased, such that signal slope, slew rate, and/or pulse width quality of the YW signal may be improved. This may help to improve the speed of the read/write operations of a memory array (e.g., array 105 of FIG. 1).

The timing circuitry 330 may be coupled to the shaping circuitry 320, and may be configured to control when the shaping circuitry 320 further drives the YW signal on the YW line 210 to one or more asserted voltage levels. As further described below, the timing circuitry 330 may be configured to disable or enable the shaping circuitry 320 to avoid conflicting with the signal on the YW line 210. For example, the timing circuitry 330 may be configured to avoid applying a power supply voltage (e.g., $V_{DD}$) to the YW line 210 during a falling edge of the YW signal on the line 210. In another example, the timing circuitry 330 may be configured to avoid applying ground voltage to the YW line 210 during a rising edge of the YW signal on the line 210.

As shown in FIG. 3, the shaper circuitry 320 may be coupled to the YW line 210 proximately toward a middle portion of the YW line 210. Alternatively, as shown in FIG. 4, the shaper circuitry 320 may be coupled to the YW line 210 proximately toward an end that is opposite from the YW line driver 220.

Figure 4:
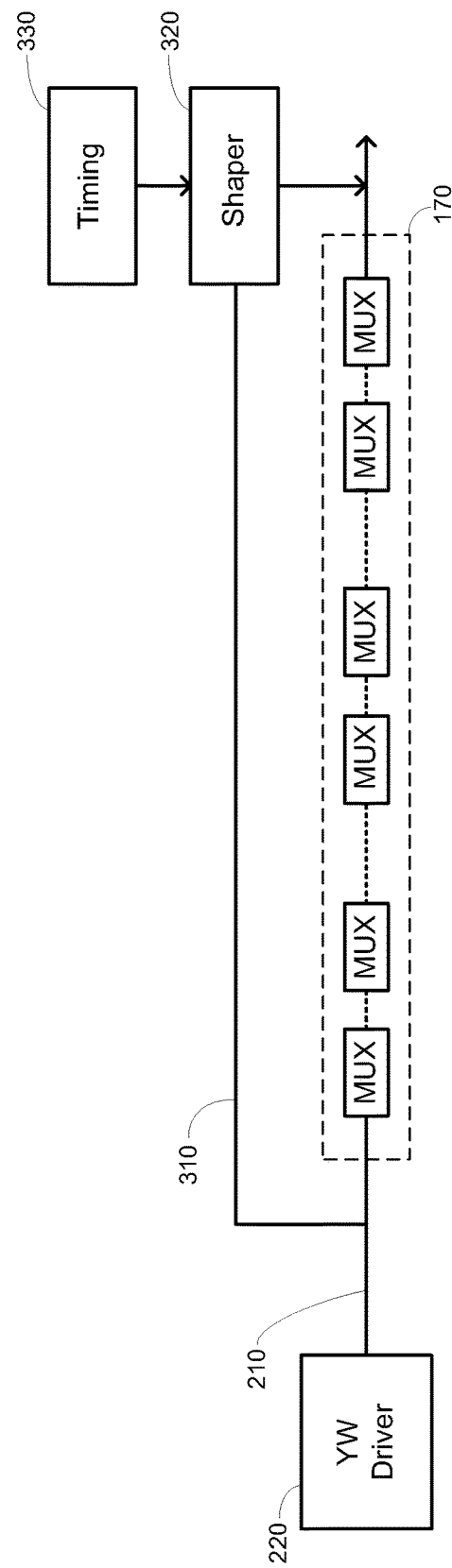

Coupling the shaper circuitry 320 proximate to the middle of the YW line 210 (i.e., FIG. 3) may drive the YW signal on the YW line 210 toward the one or more asserted voltage levels more quickly than by coupling the shaper circuitry 320 proximate to the end of the YW line 210 (i.e., FIG. 4). As such, the YW signal on the YW line 210 of FIG. 3 may more quickly have an improved signal slope, slew rate, and/or pulse width quality when compared to the counterpart in FIG. 4. However, the implementation as shown in FIG. 3 may necessitate a breaking of core and inserting the shaper circuitry 320 between the core memory array, and would have a greater area penalty than the implementation of FIG. 4.

In addition, though the examples and figures above describe the implementations in terms of a write column select signal YW, they may also apply to one or more other control signals. In particular, as described above, a control line 310, shaper circuitry 320, and timing circuitry 330 may be used to further drive a control signal on a line 210 to one or more asserted voltage levels. In one implementation, a control signal may have its own dedicated shaper circuitry and timing circuitry. In another implementation, one or more control signals may share a shaper circuitry and/or timing circuitry.

Figure 5:
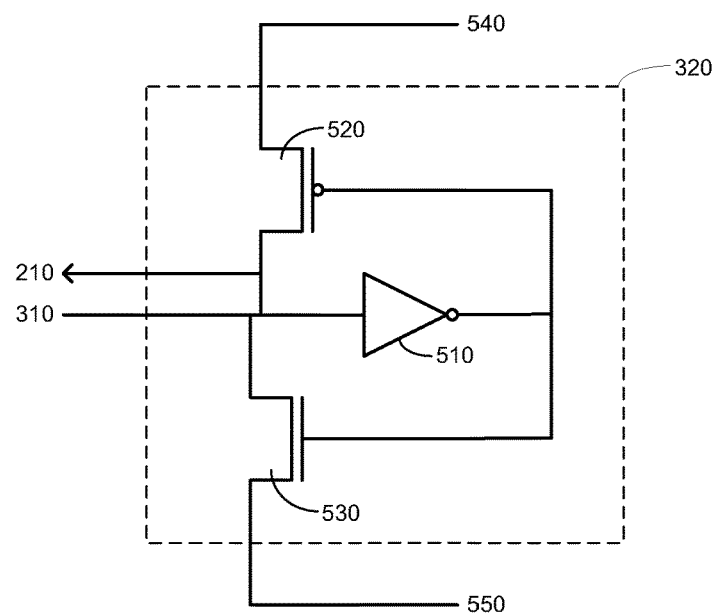
FIG. 5 illustrates a schematic diagram of a shaper circuitry in accordance with various implementations described herein.

In one implementation, FIG. 5 illustrates a schematic diagram of the shaper circuitry 320 in accordance with various implementations described herein. In particular, the shaper circuitry 320 may include an inverter 510, a PMOS clamping transistor 520, and a NMOS clamping transistor 530. As shown, the shaper circuitry 320 may be coupled to the YW line 310, where the inverter 510 is configured to receive a YW signal from the YW line 310. As noted above, the YW line 310 may be implemented using a different metal layer than that of the YW line 210 (e.g., M1), such as an upper metal layer of the IC 100 (e.g., M3).

The output of the inverter 510 is coupled to the gate terminals of both the PMOS clamping transistor 520 and the NMOS clamping transistor 530. The source terminal of the PMOS clamping transistor 520 may be coupled to a timed supply node 540, and the source terminal of the NMOS clamping transistor 530 may be coupled to a timed reference node 550.

The drain terminals of the PMOS clamping transistor 520 and the NMOS clamping transistor 530 may both be coupled to the YW line 210. As such, when the PMOS clamping transistor 520 is activated, the transistor 520 may be configured to drive the drive the YW signal on the YW line 210 toward a voltage level provided by the timed supply node 540. Similarly, when the NMOS clamping transistor 530 is activated, the transistor 530 may be configured to drive the YW signal on the YW line 210 toward a voltage level provided by the timed reference node 550.

Figure 6:
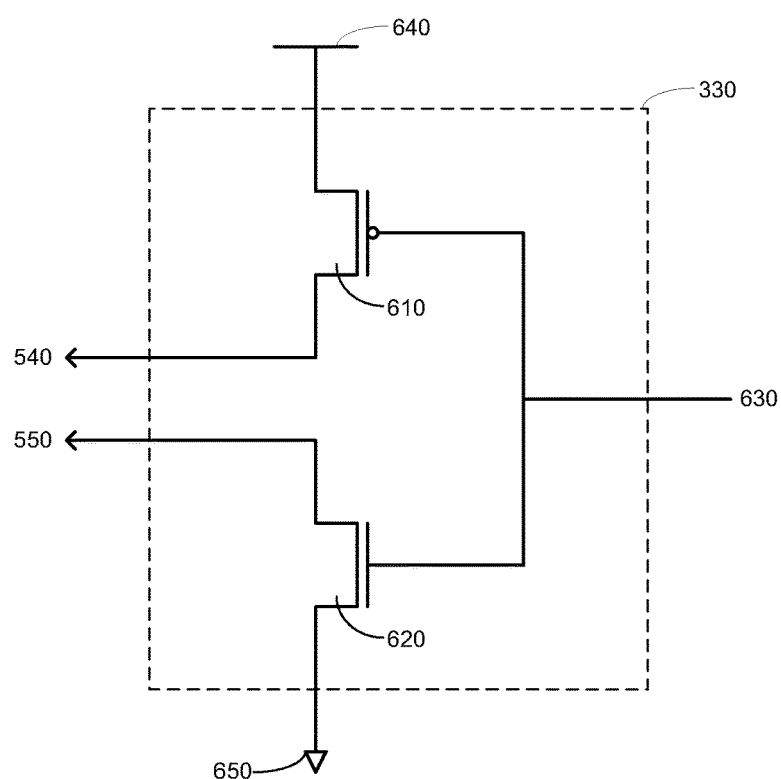
FIG. 6 illustrates a schematic diagram of a timing circuitry in accordance with various implementations described herein.

Further, FIG. 6 illustrates a schematic diagram of the timing circuitry 330 in accordance with various implementations described herein. In particular, the timing circuitry 330 may include a PMOS header transistor 610 and a NMOS footer transistor 620. As shown, the gate terminals of both the PMOS header transistor 620 and the NMOS header transistor 630 may be driven by a tracking signal 630. As further explained below, the tracking signal 630 may be a delayed version of the YW signal on the line 310, where the delay amount may be predetermined.

As also shown, the drain terminal of the PMOS header transistor 610 may be coupled to the timed supply node 540, and the drain terminal of the NMOS footer transistor 620 may be coupled to the timed reference node 550. Further, the source terminal of the PMOS header transistor 610 may be coupled to a power supply voltage source 630. In one implementation, the power supply voltage source 640 may provide a voltage level substantially equal to one of the voltage levels asserted on YW line 210 by YW line driver 220 of FIG. 2. In addition, the source terminal of the NMOS footer transistor 620 may be coupled to a reference voltage source 650. In one implementation, the reference voltage source 650 may provide a ground voltage level, which may be substantially equal to one of the voltage levels asserted on YW line 210 by YW line driver 220 of FIG. 2.

As such, when the PMOS header transistor 610 is activated by the tracking signal 630, the transistor 610 may be configured to provide a voltage from the supply voltage source 640 at the timed supply node 540. In one implementation, the voltage level from the supply voltage source 640 may be substantially equal to $V_{DD}$. In another implementation, an inverter may be used instead of the PMOS header transistor 610. Further, when the NMOS footer transistor 620 is activated by the tracking signal 630, the transistor 620 may be configured to provide a voltage from the reference voltage source 650 at the timed reference node 550, which may be equal to a ground voltage.

Figure 7:
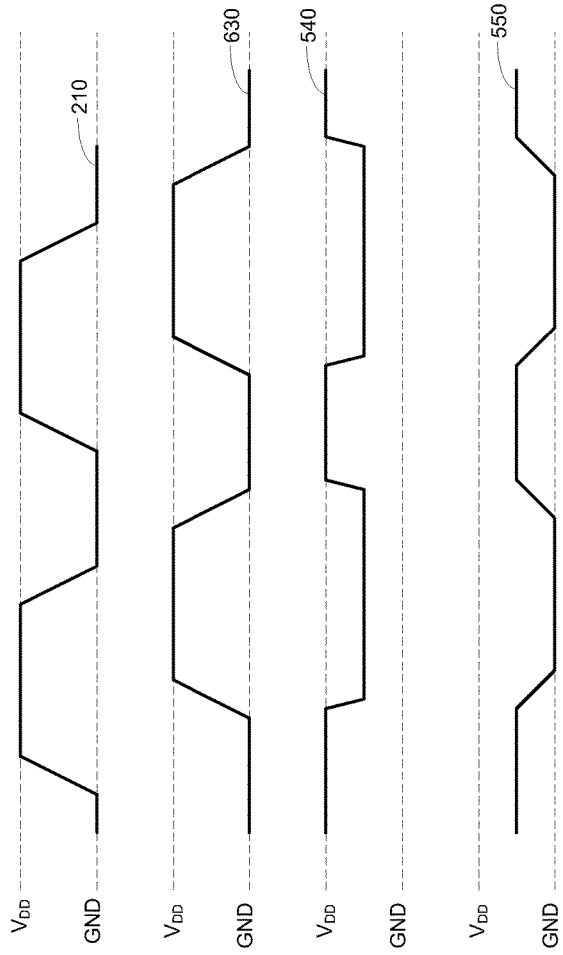
FIG. 7 illustrates a timing diagram in accordance with various implementations described herein.

FIG. 7 illustrates a timing diagram 700 in accordance with various implementations described herein. In particular, the timing diagram 700 may be used to show the operation of the shaper circuitry 320 and the timing circuitry 330 with respect to the YW signal in an IC 100. It should be noted that the various implementations described herein may also produce timing diagrams that are different from that shown in FIG. 7.

As shown, the YW signal on the YW line 210 is initially set to a low voltage level. For example, the YW line 210 may be set to substantially a ground voltage level. Being a delayed version of the YW signal on the line 310, the tracking signal 630 may also be set to the low voltage level. As discussed above with respect to FIG. 6, this low tracking signal 630 may activate the PMOS header transistor 610, thereby setting the voltage level at the timed supply node 540 to the voltage level from the supply voltage source 630, which may be substantially equal to $V_{DD}$. The NMOS footer transistor 620, however, remains deactivated, thereby allowing the voltage level at the timed reference node 550 to float.

As the YW signal on the YW line 210 rises toward a high voltage level (e.g., $V_{DD}$), the YW signal on the faster M3 line 310 may trip the inverter 510 of FIG. 5, thereby activating the PMOS clamping transistor 520. The high voltage level at the timed supply node 540 (e.g., $V_{DD}$) may then be driven to the YW signal on the YW line 210 using the transistor 520 to help improve the rising slope of the signal.

After a predetermined amount of delay, the tracking signal 630 may also reach a high voltage level (e.g., $V_{DD}$). As discussed above with respect to FIG. 6, this high tracking signal 630 may activate the NMOS footer transistor 620, thereby setting the voltage level at the timed reference node 550 to the voltage level from the reference voltage source 650, which may be a ground voltage level. The PMOS header transistor 610, however, may become deactivated, thereby allowing the voltage level at the timed supply node 540 to float.

As the YW signal on the YW line 210 falls toward a low voltage level (e.g., ground voltage (GND)), the YW signal on the faster M3 line 310 may trip the inverter 510, thereby activating the NMOS clamping transistor 530. The low voltage level at the timed reference node 550 (e.g., ground voltage) may then be driven to the YW signal on the YW line 210 using the transistor 530 to help improve the falling slope of the signal. As shown above, the delayed nature of the tracking signal 630 helps to ensure that PMOS clamping transistor does not interfere with the falling YW signal by providing a low voltage level at the timed reference node 550. After the predetermined amount of delay, the tracking signal 630 may also reach the low voltage level (e.g., ground voltage). The timing diagram may then continuously repeat the same pattern as discussed above.

The delayed tracking signal 630 and the timing circuitry 330 may be configured to avoid contention with the YW signal on the YW line 210. In particular, the delayed tracking signal 630 and the timing circuitry 330, as shown above, help to drive a high voltage level (e.g., $V_{DD}$) to the YW line 210 during a rising edge of the YW signal using the PMOS clamping transistor 520. In addition, the delayed tracking signal 630 and the timing circuitry 330 help to drive a low voltage level (e.g., ground voltage) to the YW line 210 during a falling edge of the YW signal using the NMOS clamping transistor 530. As such, the predetermined delay for the tracking signal 630 may determined based on the avoidance of contention.

In one implementation, the NMOS clamping transistor 530 of the shaper circuitry 320, along with the NMOS footer transistor 620 of the timing circuitry 330 may both be optional. In such an implementation, the shaper circuit 320 may be configured to drive a voltage level to the YW line 210 during a rising edge of the YW signal, but not the falling edge. In another implementation, the shaper circuit 320 may be configured to drive a voltage level to the YW line 210 during a falling edge of the YW signal, but not the rising edge. The shaper circuit 320 and the timing circuitry 330 may be configured to drive a voltage level to the YW line 210 based on a critical edge of the YW signal.

In sum, the shaper circuitry 320 may be configured to apply a power supply voltage (e.g., $V_{DD}$) to the YW line 210 during a rising edge of the YW signal on the line 210, and the shaper circuitry 320 may also be configured to apply a reference voltage (e.g., a ground voltage) to the line 210 during a falling edge of the YW signal on the line 210. In particular, the shaper circuitry 320 may apply its voltages proximate to a middle of the YW line 210 or proximate to an end of the YW line 210. By doing so, the ability of the YW signal on the YW line 210 to rise or fall toward an asserted voltage level may be increased, such that signal slope, slew rate, and/or pulse width quality of the YW signal may be improved. This may help to improve the speed of the read/write operations of a memory array (e.g., array 105 of FIG. 1). Further, the tracking signal 630 and the timing circuitry 330 may be used to avoid conflicts with the line 210, such as by avoiding an application of a power supply voltage (e.g., $V_{DD}$) to the YW line 210 during a falling edge of the YW signal on the line 210 or an application of a reference voltage (e.g., ground voltage) to the YW line 210 during a rising edge of the YW signal on the line 210.

In addition, though the examples and figures above describe the implementations in terms of a write column select signal YW, they may also apply to one or more other control signals discussed above.

Word Line Signals

As noted above, critical signals may include one or more word line signals. In addition, one or more word lines may be used to carry the one or more word line signals, and that word line drivers (e.g., word line drivers 150 of FIG. 1) may be used to drive a word line signal on a word line of a memory array to one or more asserted voltage levels.

Figure 8:
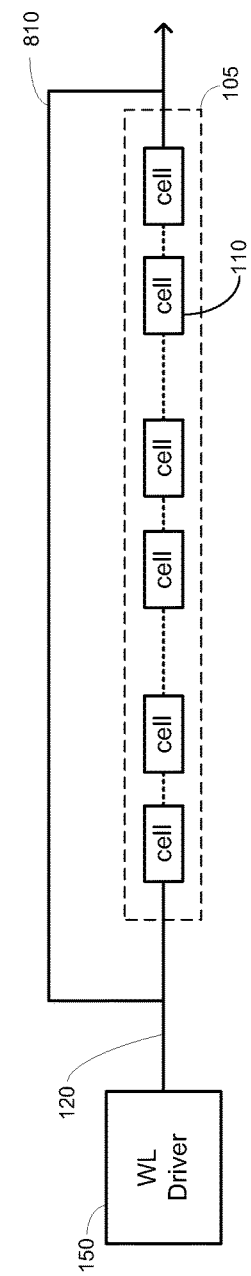
FIG. 8 illustrates a block diagram of a word line in connection with various implementations described herein.

For example, FIG. 8 illustrates a block diagram of a word line (WL) 120 in connection with various implementations described herein. As shown, the word line 120 may be coupled to a word line driver 150, which may be coupled to one end of the word line 120 and configured to drive a word line signal on the word line 120 to one or more asserted voltage levels. In one implementation, the word line 120 may be implemented using lower metal layer of the IC 100, such as a first metal layer (M1). In addition, as shown, the word line 120 may be coupled to a number of memory cells 110. As such, the resistive and capacitive loads from the word line 120 itself and each memory cell 100 may degrade signal slope, slew rate, and/or pulse width quality of the word line signal, such that the word line signal may fail to reach the one or more asserted voltage levels. In addition, a global word line (GWL) 810 may be used, where the global word line may not be coupled to any of the memory cells 110.

Figure 9:
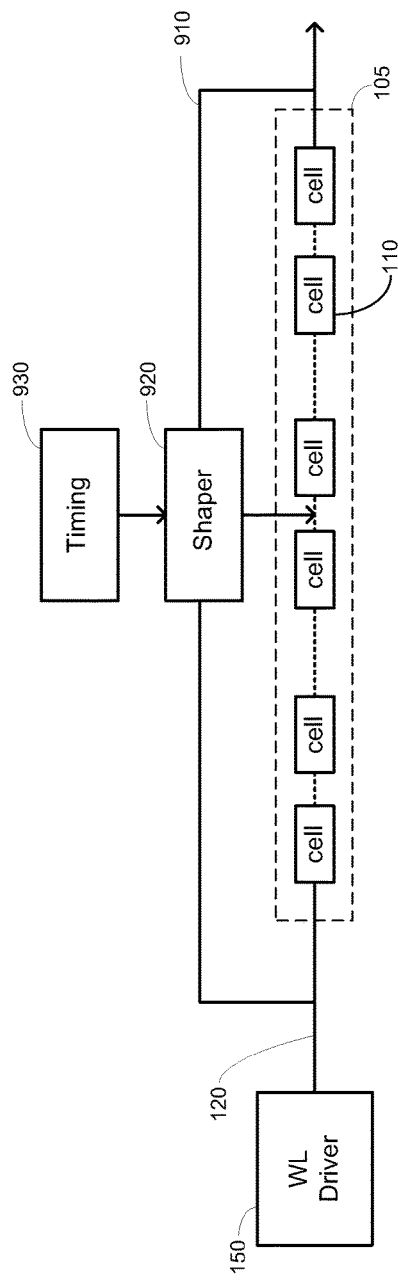
FIGS. 9-10 illustrate block diagrams of a word line and a global word line in accordance with various implementations described herein.

As shown in FIG. 9, in one implementation, a global word line 910, a shaper circuitry 920, and a timing circuitry 930 may be used to further drive the word line signal on the word line 120 to one or more asserted voltage levels. In particular, FIG. 9 illustrates a block diagram of the word line 120 and a global word line 910 in accordance with various implementations described herein.

In particular, the shaper circuitry 920 may be coupled to the word line 120, and it may be configured to further drive the word line signal on the word line 120 toward the one or more asserted voltage levels, as described later in more detail. For example, the shaper circuitry 920 may be configured to apply a power supply voltage (e.g., $V_{DD}$) to the word line 120 to further drive the word line signal on the word line 120 toward a $V_{DD}$ voltage level. In another example, the shaper circuitry 920 may be configured to apply a ground voltage to the word line 120 to further drive the word line signal on the word line 120 toward a reference voltage level.

The shaper circuitry 920 may also be coupled to the global word line 910, where the signal on the global word line 910 may be used to trigger the operation of the shaper circuitry 920. As shown, in addition to the line 120, the word line driver 150 may be configured to also drive the signal on the line 910 to one or more asserted voltage levels. However, the line 310 may be implemented using a different metal layer than that of the word line 120, such as an upper metal layer of the IC 100 (e.g., a third metal layer (M3)). Further, as shown, the global word line 910 may not be coupled to the memory cells 110. As such, the global word line 910 may not be encumbered by the resistive and capacitive loads from each memory cell 110, in contrast to the word line 120. Accordingly, the signal on the global word line 910 may reach the one or more asserted voltage levels faster than the signal on the word line 120.

As similarly discussed above with respect to FIGS. 3-4, using the faster signal on the global word line 910 to trigger the shaper circuitry 920 may allow the shaper circuitry 920 to further drive the signal on the word line 120 during a rising edge and/or falling edge of the signal on the line 120.

For example, the shaper circuitry 920 may be configured to apply a power supply voltage (e.g., $V_{DD}$) to the line 120 during a rising edge of the signal on the line 120. In another example, the shaper circuitry 920 may be configured to apply a ground voltage to the line 120 during a falling edge of the word line signal on the line 120. In such an example, the ability of the word line signal on the word line 120 to rise or fall toward an asserted voltage level may be increased, such that signal slope, slew rate, and/or pulse width quality of the word line signal may be improved. This may help to improve the speed of the read/write operations of a memory array (e.g., array 105 of FIG. 1).

As also similarly discussed above with respect to FIGS. 3-4, the timing circuitry 930 may be coupled to the shaping circuitry 920, and may be configured to control when the shaping circuitry 920 further drives the word line signal on the word line 120 to one or more asserted voltage levels. Just like timing circuitry 330, the timing circuitry 930 may be configured to disable or enable the shaping circuitry 920 to avoid conflicting with the signal on the word line 120.

Figure 10:
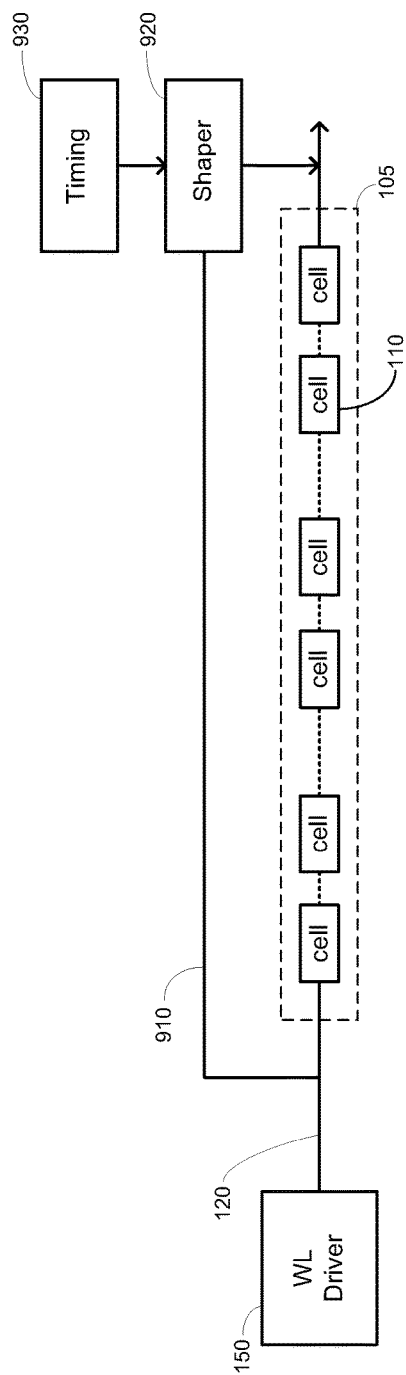

As shown in FIG. 9, the shaper circuitry 920 may be coupled to the word line 120 proximately toward a middle portion of the line 120. In another implementation, as shown in FIG. 10, the shaper circuitry 920 may be coupled to the word line 120 proximately toward an end that is opposite from the word line driver 150. As similarly discussed above with respect to FIGS. 3-4, the word line signal on the word line 120 of FIG. 9 may more quickly have an improved signal slope, slew rate, and/or pulse width quality when compared to the counterpart in FIG. 10.

Figure 11:
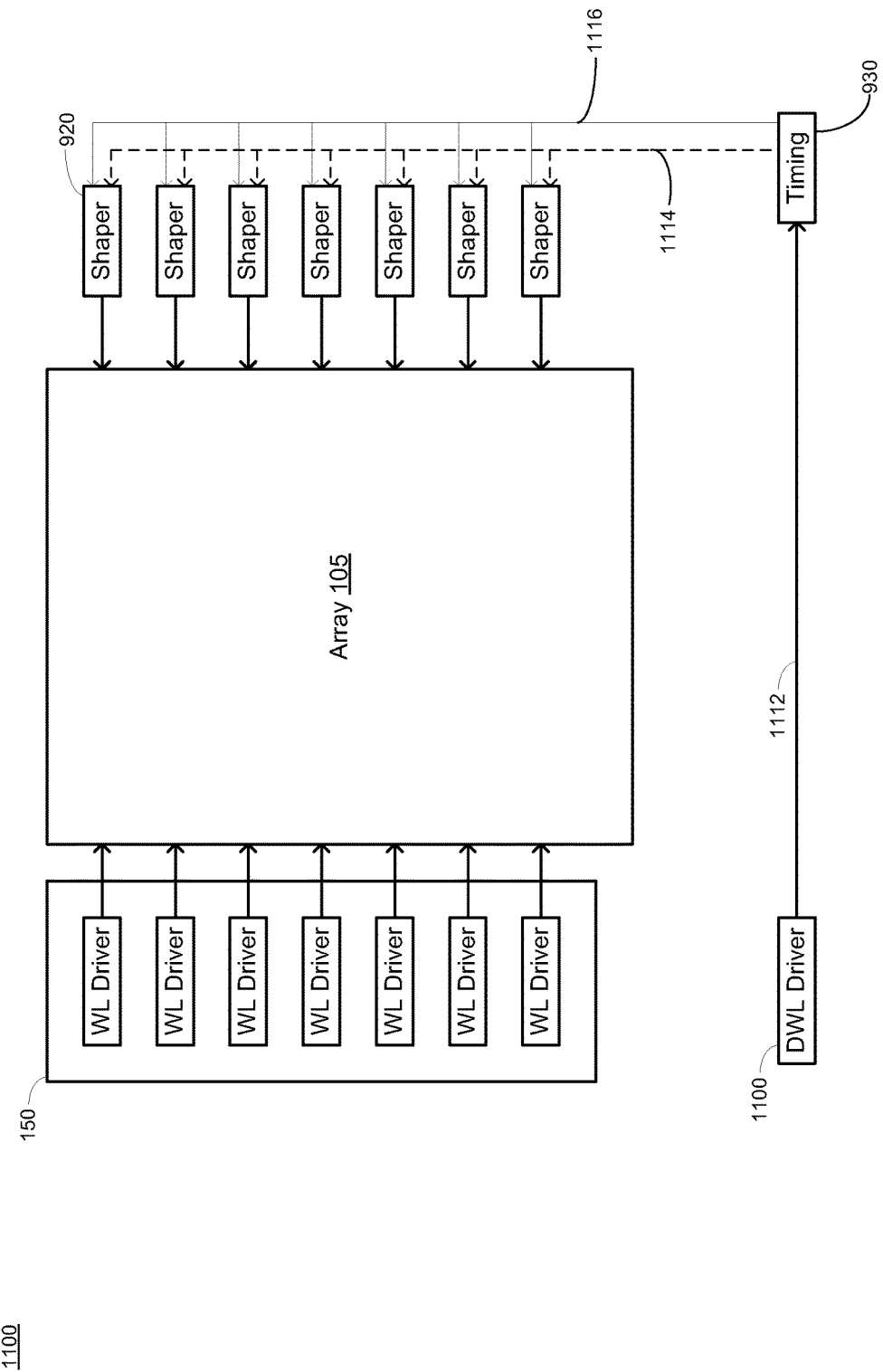
FIG. 11 illustrates a block diagram of an integrated circuit in accordance with various implementations described herein.

FIG. 11 illustrates a block diagram of an embedded memory device 1100 in accordance with various implementations described herein. In particular, the device 1100 may include the memory array 105, the word line drivers 150, a plurality of shaper circuitries 920, and a single timing circuitry 930. Similar to FIG. 10, each row of the array 105 may have a word line driver 150 coupled to one end and a shaper circuitry 920 coupled to the other end. In addition, the timing circuitry 930 may be shared across the device 1100, such that it is coupled to each instance of the shaper circuitry 920. In one implementation, the timing circuitry 930 may be placed proximate to a bottom of the array 105 and proximate to a column cell of the array.

In another implementation, each shaper circuitry 920 may be the same as the shaper circuitry 320 discussed above with respect to FIGS. 1-7. In particular, the shaper circuitry 320 may be coupled to the global word line 910, where an inverter is configured to receive a signal from the global word line 910. Further, when a PMOS clamping transistor is activated, the PMOS clamping transistor may be configured to drive the drive the word line signal on the word line 120 toward a voltage level provided by the timed supply node. Similarly, when an NMOS clamping transistor is activated, the NMOS clamping transistor may be configured to drive the word line signal on the word line 120 toward a voltage level provided by a timed reference node.

In another implementation, the timing circuitry 930 may be the same as the timing circuitry 330 discussed above with respect to FIGS. 1-7. In particular, the gate terminals of both a PMOS header transistor and a NMOS header transistor may be driven by a dummy word line signal. As similarly discussed above with respect to FIGS. 1-7, the dummy word line signal may be a delayed version of the global word line signal on the global word line 910, where the delay amount may be predetermined. As shown in FIG. 11, a dummy word line driver (DWL) 1110 may be configured to drive the dummy word line signal on a dummy word line 1112 to one or more asserted voltage levels, where the dummy word line 1112 is coupled to the timing circuitry 930. As also shown in FIG. 11, the horizontal distance and/or RC of the dummy word line 1112 may track that of the word lines of the array 105. In addition, a line 1114 is configured to couple the plurality of shaper circuitries 920 to the timing circuitry 930 via the timed supply nodes 540. Similarly, a line 1116 is configured to couple the plurality of shaper circuitries 920 to the timing circuitry 930 via the timed reference nodes 550. Both lines 1114 and 1116 may be routed vertically and may track the vertical distance and/or RC of a rowclk signal line of the array 105.

As such, when the PMOS header transistor is activated by the dummy word line signal 1110, the PMOS header transistor may be configured to provide a voltage from a supply voltage source at the timed supply node. In one implementation, the voltage level from the supply voltage source may be substantially equal to $V_{DD}$. In another implementation, an inverter may be used instead of the PMOS header transistor. Further, when an NMOS footer transistor is activated by the dummy word line signal 1110, the NMOS footer transistor may be configured to provide a voltage from a reference voltage source at the timed reference node, which may be equal to a ground voltage. The timing diagram of the device 1100 may be similar to the timing diagram discussed above with respect to FIG. 7.

In sum, and similar to the implementations of FIGS. 1-7, the shaper circuitry 920 may be configured to apply a power supply voltage (e.g., $V_{DD}$) to a word line 120 during a rising edge of the word line signal on the word line 120, and the shaper circuitry 920 may also be configured to apply a reference voltage (e.g., a ground voltage) to the word line 120 during a falling edge of the word line signal on the word line 120. In particular, the shaper circuitry 920 may apply its voltages proximate to a middle of the word line 120 or proximate to an end of the word line 120. By doing so, the ability of the word line signal on the word line 120 to rise or fall toward an asserted voltage level may be increased, such that signal slope, slew rate, and/or pulse width quality of the word line signal may be improved. This may help to improve the speed of the read/write operations of a memory array (e.g., array 105 of FIG. 1). Further, the dummy word line signal and the timing circuitry 930 may be used to avoid conflicts with the word line 120, such as by avoiding an application of a power supply voltage (e.g., $V_{DD}$) to the word line 120 during a falling edge of the word line signal on the word line 120 or an application of a reference voltage (e.g., ground voltage) to the word line 120 during a rising edge of the word line signal on the word line 120.

Figure 12:
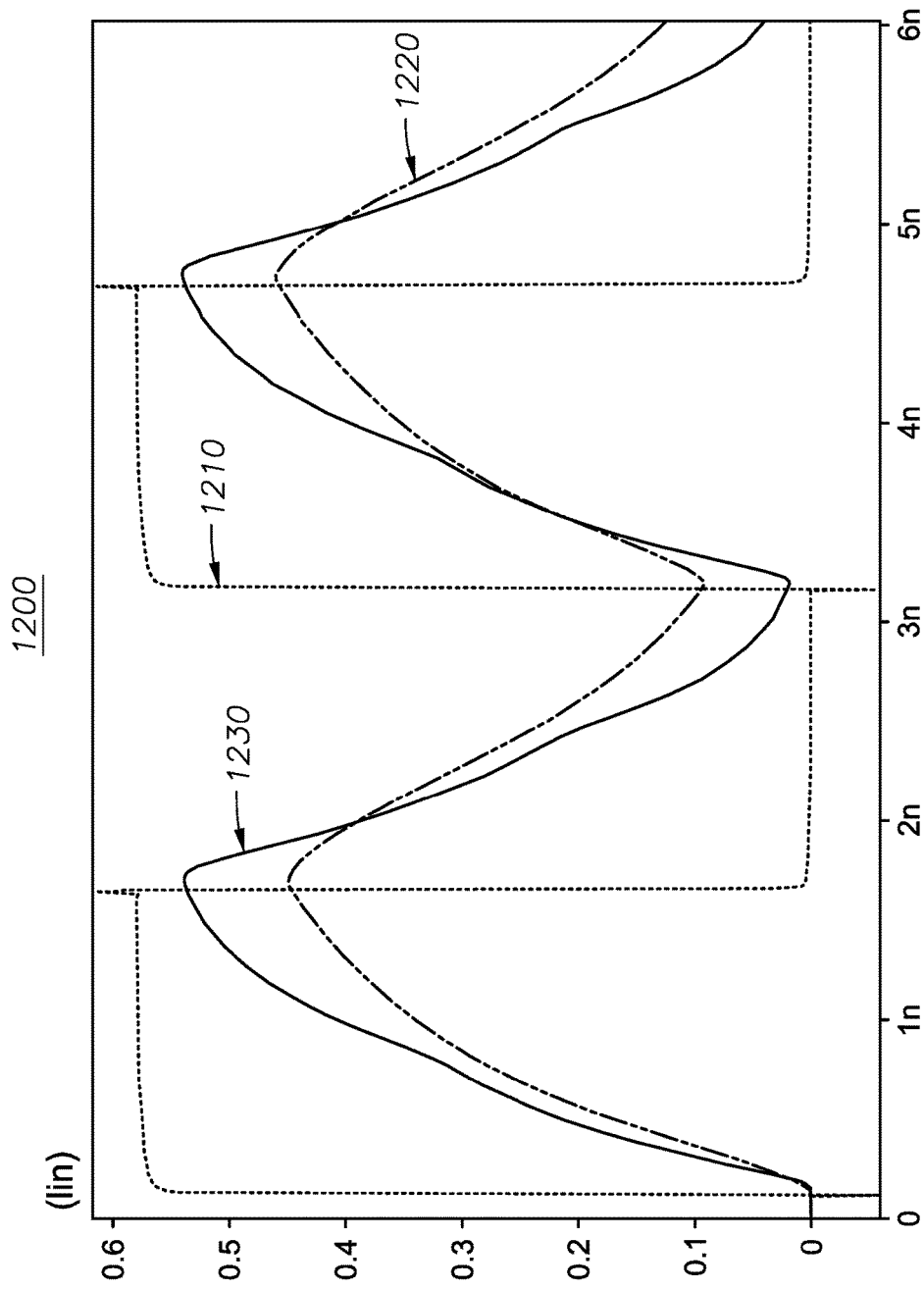
FIG. 12 illustrates a signal diagram in accordance with various implementations described herein.

For example, FIG. 12 illustrates a signal diagram 1200 in accordance with various implementations described herein. The diagram 1200 shows the ability of a word line signal to rise toward an asserted voltage level under various circumstances. In particular, the line 1210 indicates a word line signal as measured from an output of a word line driver, where the word line driver is configured to drive the signal between approximately 0.55 V and 0 V. The line 1220 shows the ability of the word line signal to rise and fall to these asserted voltage levels when shaping circuitry 920 are not coupled to an end of a word line and timing circuitry 930 are not present. The signal line 1230 shows a word line signal that uses a shaping circuitry 920 coupled to the end of a word line and the use of the timing circuitry 930. As shown, the signal line 1230 represents a word line signal that rises and falls closer to the asserted voltage levels than the signal line 1220.

Accordingly, in view of the implementations discussed above with respect to FIGS. 1-12, a shaping circuitry and a timing circuitry may be used to further drive a critical signal on a critical line toward one or more asserted voltage levels. By doing so, the speed with which the critical signal on the critical line rises or falls toward an asserted voltage level may be increased. This may help to improve the speed of the read/write operations of a memory array (e.g., array 105 of FIG. 1). Such improvements in speed of memory array operations may be done without a large impact on core efficiency, and the improvements may be experienced at slow process corners, lower operating voltages, smaller IC geometries, wide memory array geometries, and/or the like. In some embedded memory devices, shaping circuitries and timing circuitries may be used for word lines and multiple control signals.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory array comprising a plurality of memory cells, wherein the memory cells are configured to be accessed based on a first control line voltage level on a first control line;
   a control driver circuitry coupled to a column multiplexer via the first control line and coupled to a second control line, wherein the control driver circuitry is configured to drive a first control signal of the first control line and a second control signal of the second control line toward a first voltage level or a second voltage level;
   a shaper circuitry coupled to the first control line and to the second control line, wherein the shaper circuitry comprises a first clamping transistor configured to couple the first control line to a timed supply node in response to the control driver circuitry driving the second control signal toward the first voltage; and
   a timing circuitry coupled to the first shaper circuitry, wherein the timing circuitry comprises a header transistor configured to couple the timed supply node to a voltage supply source based on a third control signal voltage level of a third control signal, wherein a voltage supply source voltage level provided by the voltage supply source is substantially equal to the first voltage level, and wherein the third control signal voltage level corresponds to a second control signal voltage level of the second control signal after a predetermined delay.

2. The integrated circuit of claim 1, wherein the first control signal is a write column select signal, a read column select signal, a write enable signal, or a pre-charge signal.

3. The integrated circuit of claim 1, wherein the first control line has a higher resistive load and a higher capacitive load than the second control line.

4. The integrated circuit of claim 1, wherein the shaper circuitry is coupled to the first control line at a location that is proximate to a middle of the first control line.

5. The integrated circuit of claim 1, wherein the shaper circuitry is coupled to the first control line at an opposite end from the control driver circuitry.

6. An integrated circuit, comprising:
a memory array comprising a plurality of memory cells, wherein the memory cells are configured to be accessed based on a first control line voltage level on a first control line;
a control driver circuitry coupled to the first control line and a second control line, wherein the control driver circuitry is configured to drive a first control signal of the first control line and a second control signal of the second control line toward a first voltage level or a second voltage level;
a shaper circuitry coupled to the first control line and to the second control line, wherein the shaper circuitry comprises a first clamping transistor configured to couple the first control line to a timed supply node in response to the control driver circuitry driving the second control signal toward the first voltage; and
a timing circuitry coupled to the first shaper circuitry, wherein the timing circuitry comprises a header transistor configured to couple the timed supply node to a voltage supply source based on a third control signal voltage level of a third control signal, wherein a voltage supply source voltage level provided by the voltage supply source is substantially equal to the first voltage level, and wherein the third control signal voltage level corresponds to the second control signal voltage level of the second control signal after a predetermined delay,
wherein the shaper circuitry further comprises a second clamping transistor configured to couple the first control line to a timed reference node in response to the control driver circuitry driving the second control signal toward the second voltage level.

7. The integrated circuit of claim 6, wherein the shaper circuitry further comprises an inverter configured to receive the second control signal, and wherein an output of the inverter is configured to drive a gate terminal of the first clamping transistor and a gate terminal of the second clamping transistor.

8. The integrated circuit of claim 6, wherein the first clamping transistor is a PMOS transistor configured to drive the first control signal toward the first voltage level, and wherein the second clamping transistor is an NMOS transistor configured to drive the first control signal toward the second voltage level.

9. The integrated circuit of claim 6, wherein the timing circuitry further comprises:
a footer transistor configured to couple the timed reference node to a reference voltage source based on the voltage level of the third control signal, wherein the voltage level provided by the reference voltage source is substantially equal to the second voltage level.

10. The integrated circuit of claim 9, wherein the header transistor comprises a PMOS transistor and the footer transistor comprises a NMOS transistor, the voltage level provided by the voltage supply source is substantially equal to VDD, and the voltage level provided by the reference voltage source is substantially equal to a ground voltage.

11. The integrated circuit of claim 6, wherein the predetermined delay of the third control signal is determined based on having the first clamping transistor drive the first control signal toward the first voltage level during a rising edge of the first control signal, and wherein the predetermined delay of the third control signal is determined based on having the second clamping transistor drive the first control signal toward the second voltage level during a falling edge of the first control signal.

12. An integrated circuit, comprising:
a memory array comprising a plurality of memory cells, wherein the memory cells are configured to be accessed based on a wordline voltage level on one or more word lines;
one or more word line driver circuitries coupled to the one or more word lines and a global word line, wherein a respective word line driver circuitry is configured to drive a first signal of a respective word line and a second signal of the global word line toward a first voltage level or a second voltage level;
one or more shaper circuitries coupled to the one or more word lines and to the global word line, wherein a respective shaper circuitry comprises:
a first clamping transistor configured to couple the respective word line to a timed supply node in response to the respective word line driver circuitry driving the second signal toward the first voltage; and
a second clamping transistor configured to couple the respective word line to a timed reference node in response to the respective word line driver circuitry driving the second signal toward the second voltage level; and
a timing circuitry coupled to the first shaper circuitry, comprising:
a header transistor configured to couple the timed supply node to a voltage supply source based on a third signal voltage level of a third signal, wherein a voltage supply source voltage level provided by the voltage supply source is substantially equal to the first voltage level, and wherein the third signal voltage level corresponds to a second voltage level of the second signal after a predetermined delay; and
a footer transistor configured to couple the timed reference node to a reference voltage source based on the third signal voltage level, wherein a reference voltage source voltage level provided by the reference voltage source is substantially equal to the second voltage level.

13. The integrated circuit of claim 12, wherein the shaper circuitry further comprises an inverter configured to receive the second signal, and wherein an output of the inverter is configured to drive a gate terminal of the first clamping transistor and a gate terminal of the second clamping transistor.

14. The integrated circuit of claim 12, wherein the predetermined delay of the third signal is determined based on having the first clamping transistor drive the first signal toward the first voltage level during a rising edge of the first signal, and wherein the predetermined delay of the third signal is determined based on having the second clamping transistor drive the first signal toward the second voltage level during a falling edge of the first signal.

15. The integrated circuit of claim 12, wherein the first signal, second signal, and third signal are word line signals.

16. The integrated circuit of claim 12, wherein the timing circuitry is positioned proximate to a bottom of the memory array.

17. An integrated circuit, comprising:
- a memory array comprising a plurality of memory cells, wherein the memory cells are configured to be accessed based on a first control line voltage level on a first control line;
- a control driver circuitry coupled to the first control line and a second control line, wherein the control driver circuitry is configured to drive a first control signal of the first control line and a second control signal of the second control line toward a first voltage level or a second voltage level;
- a shaper circuitry coupled to the first control line at a location that is proximate to a middle of the first control line and coupled to the second control line, wherein the shaper circuitry comprises:
- a first clamping transistor configured to couple the first control line to a timed supply node in response to the control driver circuitry driving the second control signal toward the first voltage; and
- a second clamping transistor configured to couple the first control line to a timed reference node in response to the control driver circuitry driving the second control signal toward the second voltage level; and
- a timing circuitry coupled to the first shaper circuitry, comprising:
  - a header transistor configured to couple the timed supply node to a voltage supply source based on a third control signal voltage level of a third control signal, wherein a voltage supply source voltage level provided by the voltage supply source is substantially equal to the first voltage level, and wherein the third control signal voltage level corresponds to a second control signal voltage level of the second control signal after a predetermined delay; and
  - a footer transistor configured to couple the timed reference node to a reference voltage source based on the voltage level of the third control signal, wherein a reference voltage source voltage level provided by the reference voltage source is substantially equal to the second voltage level.

18. The integrated circuit of claim 17, wherein the first control line has a higher resistive load and a higher capacitive load than the second control line.

* * * * *